United States Patent [19]

Di Giulio

[11] Patent Number: 4,698,829

[45] Date of Patent: Oct. 6, 1987

[54] MONITORING SYSTEM FOR VERIFYING THAT AN INPUT SIGNAL IS TOGGLING AT A MINIMUM FREQUENCY

[75] Inventor: Peter C. Di Giulio, Easton, Conn.

[73] Assignee: Pitney Bowes Inc., Stamford, Conn.

[21] Appl. No.: 710,797

[22] Filed: Mar. 12, 1985

[51] Int. Cl.[4] .......................... G07C 3/00; G07C 3/02
[52] U.S. Cl. ........................................ 377/16; 377/76; 307/606
[58] Field of Search ...................... 377/16, 50; 371/65; 307/200 A, 200 B, 269, 271, 527, 578; 328/120, 140, 63, 109, 129.1, 72

[56] References Cited

U.S. PATENT DOCUMENTS

| | | | |
|---|---|---|---|
| 3,350,580 | 10/1967 | Harrison | 328/120 |
| 3,399,351 | 8/1968 | Reszka | 328/120 |
| 3,710,366 | 1/1973 | Welling | 328/120 |
| 3,903,474 | 9/1975 | Wiley | 328/120 |
| 4,144,448 | 3/1979 | Pisciotta et al. | 328/120 |
| 4,374,361 | 2/1983 | Holden | 328/120 |

Primary Examiner—Stanley D. Miller
Assistant Examiner—K. Ohralik
Attorney, Agent, or Firm—Michael J. DeSha; Melvin J. Scolnick; David E. Pitchenik

[57] ABSTRACT

A monitoring system for verifying that an input signal is toggling at a minimum frequency includes an edge detector to provide an output signal in response to a transition in the state of an input signal. The output signal is used to reset a resettable clock. In the event that the output signal is not received during a first reset period a first signal is generated and if there is no output within a second succeeding reset period, a second signal is generated.

31 Claims, 2 Drawing Figures

MONITORING SYSTEM FOR VERIFYING THAT AN INPUT SIGNAL IS TOGGLING AT A MINIMUM FREQUENCY

The present invention relates to monitoring circuits, and more particularly to a monitoring system for verifying that an input signal is toggling at a minimum frequency.

BACKGROUND OF THE INVENTION

In various electronic circuits it is desirable to monitor an input signal to determine if the input signal is behaving in a predetermined manner. If the input signal is not behaving properly an output signal is generated. Such circuits are generally referred to as 'watchdog' circuits. Specifically, in electronic postage meters it is desirable to monitor the output signal from a microprocessor to determine that it is toggling at a predetermined minimum frequency for proper activation of various components in the electronic postage meter, e.g., non-volatile memory (NVM).

Various electronic postage meter systems employing microprocessors have been developed, see, for example, the systems disclosed in U.S. Pat. No. 3,978,457 for Microcomputerized Electronic Postage Meter Systems, U.S. Pat. No. 3,938,095 for Computer Responsive Postage Meter, European patent application No. 80400603.9, filed May 5, 1980, which corresponds to U.S. Pat. No. 4,484,307 for Electronic Postage Meter Having Improved Security and Fault Tolerance Features, corresponding to U.S. Pat. No. 4,301,507, for Electronic Postage Meter Having Plural Computing Systems, and copending application Ser. No. 447,815, filed Dec. 8, 1982, for Stand-Alone Electronic Mailing Machine now U.S. Pat. No. 4,579,054.

Generally electronic postage meters include some form of NVM capability to store critical postage accounting information. This information includes, for example, the amount of postage remaining in the meter for subsequent printing and the total amount of postage already printed by the meter. Other types of accounting or operating data may also be stored in the non-volatile memory, as desired.

However, conditions can occur in electronic postage meters where information stored in NVM may be lost. A total line power failure or fluctuation in voltage conditions can cause the microprocessor associated with the meter to operate erratically and either cause erasure of data or the writing of spurious data in the NVM. The erasure of data or the writing of spurious data in the NVM may result in a loss of critical accounting information. Since the accounting data changes with the printing of postage and is not permanently stored elsewhere, there is no way to recapture or reconstruct the lost accounting information. Under such circumstances, it is possible that a user may suffer a loss of postage funds.

For example, the output from the microprocessor may be functioning erratically after the microprocessor is first released from its reset condition. This may cause errors in operation of the postage meter and/or the erroneous storage or erasure of data in NVM. If the output from the microprocessor is not behaving in a predetermined manner, it is desirable to signal and/or reset the microprocessor.

Various watchdog circuits are known for use in electronic postage meters. See for example, patent application Ser. No. 447,750, filed on Dec. 8, 1982 for Monitoring Circuit For An Electronic Postage Meter, now U.S. Pat. No. 4,600,987 which discloses a timing means for generating an output signal in the absence of detection of an output signal from a microprocessor within a predetermined time interval, and the aforementioned European patent application No. 80400603.9 which discloses two redundant circuits composed of multivibrators and flip-flops which are set to a fault condition based on the absence of signals from a microprocessor.

SUMMARY OF THE INVENTION

It is an object of the present invention to provide a monitoring system for verifying that an input signal is toggling at a minimum frequency.

It is a further object of the present invention to provide a monitoring system which generates a warning signal if the input signal fails to toggle at a predetermined minimum frequency within a first predetermined time period.

It is a further object of the present invention to provide a monitoring system which generates a critical signal if the input signal fails to toggle at the predetermined minimum frequency within a second predetermined time period after generation of the warning signal.

It is a further object of the present invention to provide a monitoring system for alerting a microprocessor that its output signal is not toggling properly.

It is a further object of the present invention to provide a monitoring system for resetting a microprocessor should its output signal fail to toggle properly within a predetermined period of time.

It is a still further object of the present invention to provide a monitoring system capable of functioning as an interval time, e.g., allowing a microprocessor to conduct periodic software verification.

It is a still further object of the present invention to provide a monitoring system which employs an architecture which is reliable and economical to implement.

Briefly, in accordance with the present, a monitoring system is provided for verifying that an input signal is toggling at a minimum frequency, including a circuit and associated method, comprising edge detection means for providing an output signal in response to a transition in the state of the input signal, resettable means responsive to the output signal from said edge detection means for resetting upon receipt of an output signal from said edge detection means within a first reset period, said resettable means generating a first output signal upon failing to receive an output signal from said edge detection means within the first reset period and generating a second output signal upon failing to receive an output signal from said edge detection means within a second reset period.

Other objects, aspects and advantages of the present invention should be understood from the detailed description considered in conjunction with the drawings, as follows.

DETAILED DESCRIPTION

Figure 1:
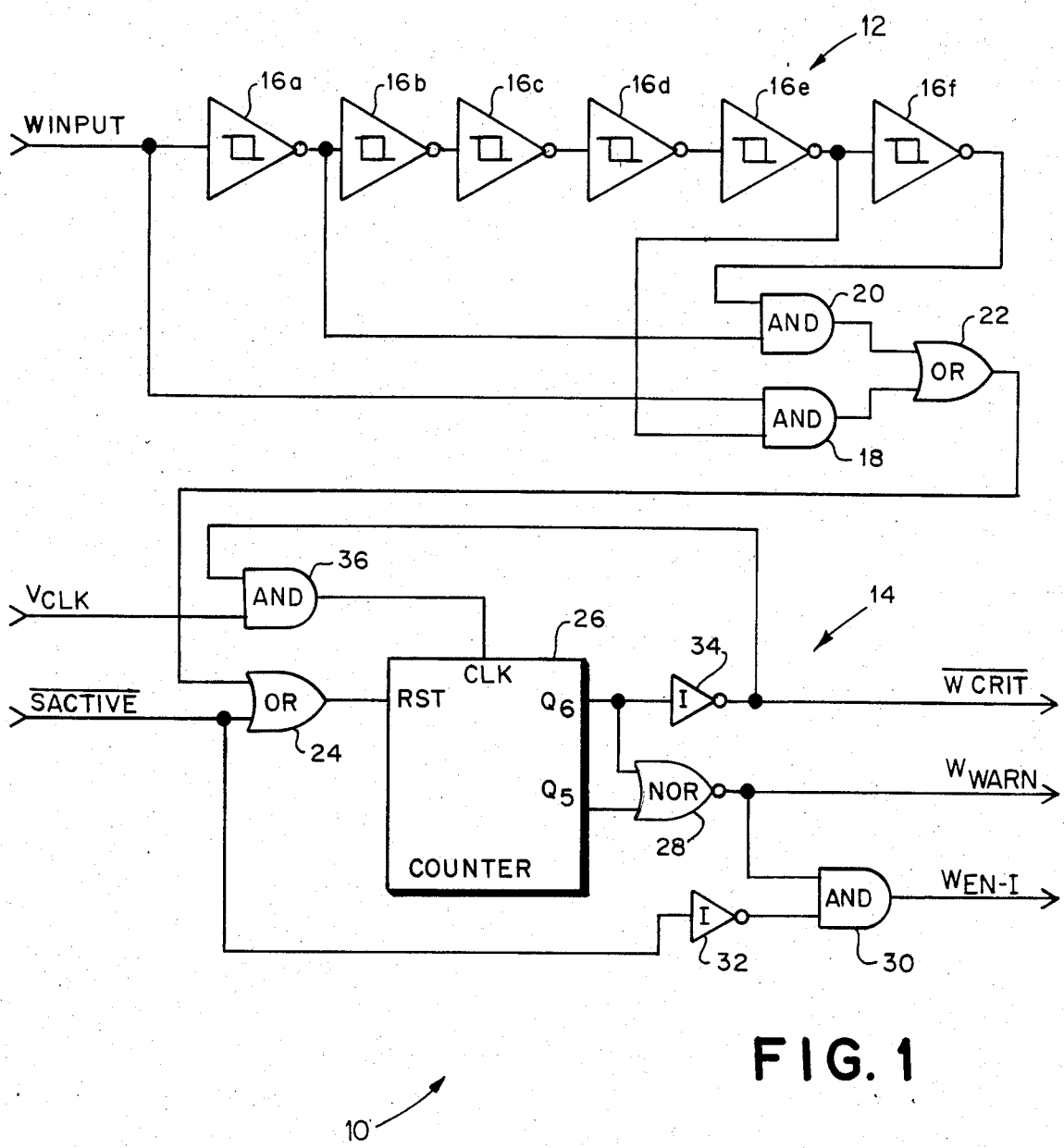
FIG. 1 is a schematic circuit diagram of a monitoring circuit in accordance with the present invention.

Referring to FIG. 1, a monitoring circuit in accordance with the present is illustrated generally at 10. The monitoring circuit 10 includes a dual edge pulse generator 12 and a multiple output pulse generator 14. The dual edge pulse generator 12 includes a plurality of Schmitt inverters 16 A-F, here six, connected in cascade. The specific number of inverters 16 is varied to provide a propagation delay and thereby regulate the pulse width of a pulse representing an edge transition in the logic state of an input signal $W_{Input}$. The input signal $W_{Input}$ is electrically coupled to a first AND gate 18 and provides one input thereto. A second input to the AND gate 18 is provided from the output of the fifth series connected Schmitt inverter 16E. A second AND gate 20 receives one of its inputs from the output of the first series connected Schmitt inverter 16A. The second input to the AND gate 20 is obtained from the sixth series connected Schmitt inverter 16F. The outputs from the AND gates 18 and 20 are electrically coupled to the input of an OR gate 22. The output of the OR gate 22 is electrically coupled to another OR gate 24 and provides one input thereto. A second input is provided to the OR gate 24 from a microprocessor and is normally active. The second input is normally held low and designated $\overline{S_{Active}}$.

The output from the OR gate 24 is electrically coupled to the reset terminal (RST) of a counter 26, which is illustrated in FIG. 1 as a five bit counter. One output terminal of the counter 26, designated $Q_5$, is electrically coupled to one input of NOR gate 28. Second output terminal of counter 26 designated $Q_6$, is electrically coupled to the other input of NOR gate 28. The output of the counter 26 present at output terminals $Q_5$ and $Q_6$ are held low when $W_{Input}$ is toggling at or above minimum frequency. When the signal present at the output terminals $Q_5$ and $Q_6$ are low, the signal present at the output of the nor gate 28 will be high, providing a normal inactive $W_{Warn}$ output signal, e.g., for transmission to the microprocessor of an electronic postage meter. However, if a high output is present at either output terminal $Q_5$ or $Q_6$, a low signal present at the output of the nor gate 28 will provide a $W_{Warn}$ output signal to the microprocessor, alerting it that $W_{Input}$ has failed to toggle within a first predetermined time period. The output of the NOR gate 28 also supplies one input to an AND gate 30. A second input to the AND gate 30 is provided by a second inverter 32 which normally received a low input from the microprocessor in the form of $\overline{S_{Active}}$.

The second output terminal of the counter 26, designated $Q_6$, is also electrically coupled to a third inverter 34. The output present at output terminal $Q_6$ is held low when $W_{Input}$ is toggling at or above a minimum frequency. When the signal present at the output terminal $Q_6$ is low, the signal present at the output of the third inverter 34 is high, providing a $W_{Crit}$ output, e.g., for transmission to the microprocessor of the meter. However, if a high output is present at the output terminal $Q_6$, a low signal present at the output of the third inverter 34 will provide a $W_{Crit}$ output signal to the microprocessor, alerting it that the $W_{Input}$ has also failed to toggle within a second predetermined time period.

An AND gate 36 is coupled to the input of the clock terminal (CLK) of the five bit counter 26. One input to the AND gate 36 is obtained from the output of the third inverter 34 and the other input to the AND gate is provided by a system clock (not shown) in the form of clock signal $V_{Clk}$.

Figure 2:
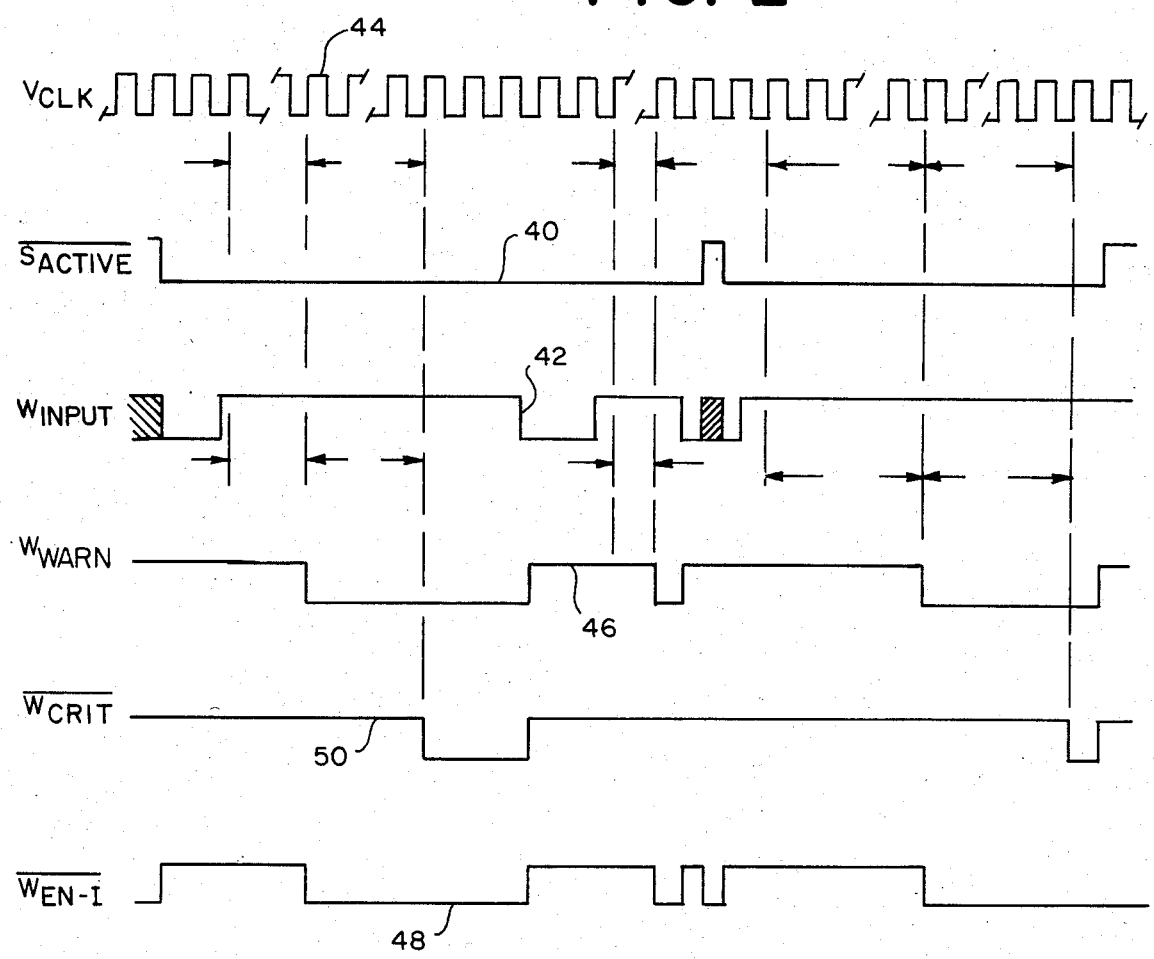
FIG. 2 is a timing diagram illustrating the relationship between the input and output waveforms of the monitoring circuit of FIG. 1.

The operation of the monitoring circuit 10 of FIG. 1 may be more readily understood by reference to the timing diagram for the various signal waveforms illustrated in FIG. 2. With the $\overline{S_{Active}}$ input waveform 40 high the counter 26 is held in its reset or inactive state and the monitoring circuit 10 is in effect inactive. However, when $\overline{S_{Active}}$ goes low the reset terminal of the counter 26 is then controlled by the output of OR gate 22 of the dual edge pulse generator 12. The output of the OR gate 22 is in turn controlled by the outputs of AND gates 18 and 20 which provide an output pulse for each edge transition in the state of the $W_{Input}$ waveform 42 from high to low or low to high. The number and propagation delay of the Schmitt inverters 16 is chosen to provide an output pulse having a pulse width at least as great as the minimum pulse width required to reset the counter 26.

The $V_{Clk}$ waveform 44 is applied to the Clock terminal of the 5 bit counter 26 through AND gate 36, one of whose inputs is normally held high by the output of the inverter 34. Thus, the $V_{Clk}$ waveform 44 provides the timing pulses for the counter 26. For a $2^5$ counter, 16 clock pulses are used to define a first maximum period $T_{Max1}$ within which the $W_{Input}$ waveform 42 must toggle. If the $W_{Input}$ waveform 42 toggles within the period $T_{Max1}$ the OR gate 22 will provide a pulse to the input of OR gate 24, causing the counter to be reset to zero before it reaches a count of 16 or the end of the period $T_{Max1}$. If the counter 26 reaches a count of 16, a high output signal is provided at output terminal $Q_5$, resulting in a low output in the form of $W_{Warn}$ waveform 46. If the $W_{Input}$ waveform toggles within the period $T_{Max2}$, the OR gate 22 will provide a pulse to the input of OR gate 24, causing the counter to be reset to zero before it reaches a count of 32 or the end of the time period $T_{Max2}$. However, if the counter reaches a count of 32, a high output signal is provided at the output terminal $Q_6$, resulting in a low output in the form of $W_{Crit}$ waveform 50. However, it should be understood that the time periods $T_{Max1}$ and $T_{Max2}$ may be unequal, as desired. Moreover, an N bit counter can be used to increase or decrease the duration of the predetermined maximum periods to whatever time is desired. Further, a pair of counters, e.g., two N-1 bit counters may be utilized to replace the single N bit counter.

The dual edge pulse generator 12 detects a transition in the edges of the $W_{Input}$ waveform 42 from high to low or low to high. Assuming the $W_{Input}$ waveform 42 applied to the first Schmitt inverter 16A is high, the output of AND gate 18 will be high only if the output of the fifth Schmitt inverter 16E is also high. This will occur only if the high $W_{Input}$ was originally low or toggled, i.e., made an edge transition from high to low, upon reaching the input of the Schmitt inverter 16E. Thus, for AND gate 18 to go high and provide a high input to OR gate 22 there must be an edge transition or toggling of the $W_{Input}$ waveform 42 from low to high. The width of the output pulse from the OR gate 22 is determined by the propagation delay period introduced by the five Schmitt inverters 16A-E.

Similarly, assuming $W_{Input}$ as initially applied to the first Schmitt inverter 16A is low, the output of the AND gate 20 will be high only if the outputs of the first Schmitt inverter 16A and sixth Schmitt inverter 16F are high. This will occur only if the high output of the Schmitt inverter 16A has gone low upon reaching the input of the Schmitt inverter 16F. Thus, for AND gate 20 to go high and provide a high input to OR gate 22 there must be an edge transition or toggling of the $W_{Input}$ waveform 42 from high to low. The width of the output pulse from the OR gate is determined by the propagation delay period introduced by the five Schmitt inverters 16B-F.

If no output pulse from the OR gate 22 is received within the period $T_{Max1}$, as determined by a first count of the counter 26, here 16 clock pulses, the output of terminal Q5 goes high and the output of the NOR gate 28 goes low providing a low $W_{Warn}$ signal as seen by the $W_{Warn}$ waveform 46. The $W_{Warn}$ signal output from the inverter 28 is sent to the microprocessor to warn or alert the same that the $W_{Input}$ signal has not toggled within the predetermined time $T_{Max1}$.

Once the $W_{Warn}$ signal appears at the output of the NOR gate 28, the AND gate 30 is deactivated and a low signal appears at the output of the AND gate 30. In the presence of the $\overline{S_{Active}}$ signal and a normally low output at terminal Q5, the high signal $W_{En-I}$ or enable input signal appears at the output of the AND gate 30. The $W_{En-I}$ waveform 48 is illustrated in FIG. 2.

If the $W_{Input}$ signal toggles within the second period $T_{Max2}$, the counter 26 is reset to zero and the output of terminal Q5 goes low, removing the low $W_{Warn}$ signal. If the $W_{Input}$ signal has not toggled at the end of a second period $T_{Max2}$, as determined by a second count of the counter 26, which may for example also be defined by 16 clock pulses, the output terminal Q6 of the counter 26 goes high resulting in a $W_{Crit}$ signal at the output of the inverter 34. Note that terminal Q5 goes low at the time, however, the output of NOR gate 28 remains low since its Q6 input is now high. The $W_{Crit}$ output is applied to the microprocessor to reset the same.

Once the microprocessor is reset a power-down routine must be executed before the meter can be reactivated. Additionally, the $W_{Crit}$ output from the inverter 34 disables the AND gate 36 and prevents the application of further clock pulses to the clock terminal until the $W_{Crit}$ signal is removed. However, subsequent toggling of the $W_{Input}$ waveform 42 will apply a pulse from the dual edge pulse generator 12 to the OR gate 24 and thus to the reset terminal (RST), resetting the counter 26 to zero and removing the low $W_{Warn}$ and $W_{Crit}$ signals.

Recapitulating, the waveforms illustrated in FIG. 2 provide the following signals:

$V_{Clk}$: This signal provides the clock or timing pulses for the monitoring circuit 10.

$W_{Input}$: This is the signal to be monitored by the monitoring circuit 10. If this input is toggled at or above a minimum frequency (period=$T_{Max1}$), then both outputs $W_{Warn}$ and $W_{Crit}$ will remain inactive (high).

$\overline{S_{Active}}$: The monitoring circuit 10 is active when this signal is active or low. Output signals $W_{Warn}$ and $W_{Crit}$ are always inactive (high) when this signal is inactive (high), thereby effectively disabling the monitoring circuit 10.

$W_{Warn}$: With the monitoring circuit 10 in its operative state, this output signal is activate (low) if $W_{Input}$ does not toggle within time period $T_{Max1}$ after it last toggled. This signal is inactivate (high) if the $W_{Input}$ signal is toggled within time period $T_{Max2}$ or when $\overline{S_{Active}}$ is inactive (high).

$W_{Crit}$: With the monitoring circuit 10 in its operative state, this output signal is activated (low) if $W_{Input}$ does not toggle within time period $T_{Max2}$ after $W_{Warn}$ becomes active (low). This signal is deactivated whenever the $W_{Input}$ signal is toggled or when $\overline{S_{Active}}$ is inactive (high).

$W_{En-I}$: This output signal provides an enable input signal to the microprocessor to indicate that the input signal $W_{Input}$ is toggling properly when the monitoring circuit 10 is active. Therefore, $\overline{S_{Active}}$ is low and $W_{Warn}$ is high.

It should be understood that the monitoring system of the present invention can also advantageously function as an interval timer. For example, when used as an interval timer in an electronic postage meter, the microprocessor may conduct a periodic software verification of the operation of the meter. The monitoring system may activate the NMI input of the microprocessor at the end of the time period $T_{Max1}$ with a $W_{Warn}$ input. The microprocessor then resets the monitoring system by toggling the $W_{Input}$ signal so that the microprocessor can perform the desired software checks on the system. If the microprocessor fails to toggle the $W_{Input}$ signal within the timer period $T_{Max2}$ after its NMI input is activated, $T_{Max2}$ $W_{Crit}$ is activated to lock the microprocessor in reset.

It should be understood by those skilled in the art that various modifications may be made in the present invention without department from the spirit and scope thereof, as described in the specification and defined in the appended claims.

What is claimed is:

1. Monitoring system for verifying that an input signal is toggling at a minimum frequency, comprising:
    edge detection means for providing an output signal in response to each transition in the state of the input signal;
    resettable means responsive to the output signal from said edge detection means for resetting upon receipt of an output signal from said edge detection means within a first reset period; and
    said resettable means generating a first output signal upon failing to receive an output signal from said edge detection means within the first reset period and generating a second output signal upon failing to receive an output signal from said edge detection means within a second following reset period.

2. The monitoring system recited in claim 1, wherein:
    said resettable means includes a clock input terminal for receiving clock timing pulses for establishing the duration of the first and second reset periods.

3. The monitoring system recited in claim 1, wherein:
    said edge detection means includes delay means for regulating the pulse width of the pulses which correspond to the edge transitions in the logic state of the input signal and gate means for providing an output to said resettable means in response to each edge transition in the logic state of the input signal.

4. The monitoring system recited in claim 1, including:
    gate means electrically coupled between said edge detection means and said resettable means for applying a reset signal to said resettable means in response to an output signal from said edge detection means.

5. The monitoring system recited in claim 4, wherein:
    said resettable means is reset by said gate means in response to a deactivating signal received by said gate means.

6. The monitoring system recited in claim 1, including:

inverter means electrically coupled to said resettable means for receiving the first and second output signals therefrom.

7. The monitoring system recited in claim 1, including:
gate means for providing a third output signal when enabled and the first output signal is absent from said resettable means.

8. The monitoring system recited in claim 2, including:
gate means electrically coupled to said clock terminal and the output of said resettable means for deactivating said clock terminal in response to the presence of the second output signal from said resettable means.

9. The monitoring system recited in claim 1, wherein:
said resettable means includes an N bit counter.

10. The monitoring system recited in claim 1, wherein:
said edge detection means includes a plurality of Schmitt inverters for regulating the pulse width of the output pulses which correspond to the edge transitions in the logic state of the input signal, first gate means coupled to said Schmitt inverters for providing an output in response to an edge transition in the state of the input signal from high to low and low to high, and second gate means coupled to said first gate means and said resettable means for providing an input signal to said resettable means in response to an output pulse from said first gate means.

11. Monitoring system for verifying that an input signal is toggling at a minimum frequency, comprising:
edge detection means for providing an output signal in response to each transition in the state of the input signal;
resettable means responsive to the output from said edge detection means for resetting upon receipt of an output signal from said edge detection means within a first reset period;
said resettable means generating a first output signal upon failing to receive an output signal from said edge detection means within the first reset time period and generating a second output signal upon failing signal from said edge detection means within a second reset period;
said resettable means including a clock input terminal for receiving clock timing pulses for establishing the duration of the first and second reset periods;
said edge detection means includes delay means for regulating the pulse width of the pulses which correspond to the edge transitions in the logic state of the input signal, and first gate means for providing an output in response to each edge transition in the logic state of the input signal;
second gate means electrically coupled between said first gate means and said resettable means for applying a reset signal to said resettable means in response to an output signal from said edge detection means and for resetting said resettable means in response to a deactivation signal;
third gate means for providing a third output signal when enabled and the first output signal is absent from said resettable means; and
fourth gate means electrically coupled to said clock input terminal and adapted to receive the second output signal from said resettable means for deactivating said clock terminal in the presence of a second output signal from said resettable means.

12. The monitoring system recited in claim 11, including:
inverter means electrically coupled to said resettable means for receiving the first and second output signals therefrom.

13. The monitoring system recited in claim 11, wherein:
said resettable means includes an N bit counter.

14. The monitoring system recited in claim 11, wherein:
said edge detection means includes a plurality of Schmitt inverters for regulating the pulse width of the output pulses which correspond to the edge transitions in the logic state of the input signal, said first gate means being coupled to said Schmitt inverters for providing an output in response to an edge transition in the state of the input signal from high to low and low to high.

15. A method for verifying that an input signal is toggling at a minimum frequency, comprising the steps of:
detecting each edge transition of changes state of an input signal;
providing pulses corresponding to each such edge transition;
providing a clock signal for timing first and second reset periods;
resetting a counter in response to detection of a pulse within the first reset period;
generating a first output signal upon failure to receive a pulse within the first reset period;
resetting the counter in response to detection of a pulse within the second reset period; and
generating a second output singal upon failure to receive a pulse within the second reset period.

16. The method recited in claim 15, wherein:
the first and second reset periods are equal.

17. The method recited in claim 15, including the step of:
regulating the pulse width of the pulses corresponding to each edge transition in accordance with the minimum pulse width of the counter.

18. The method recited in claim 15, including the step of:
generating a third output signal in the absence of the first output signal and in the presence of an activating signal.

19. The method recited in claim 15, including the step of:
inhibiting the application of the clock signal to the counter in response to the second output signal.

20. The method recited in claim 15, including the step of:
resetting the counter in the presence of a deactivating signal.

21. A method for verifying that an input signal is toggling at a minimum frequency, comprising the steps of:
generating output pulses corresponding to each transition in an input signal;
providing a clock signal for timing a reset period for a counter;
resetting the counter upon receipt of each output pulse;

generating a first output signal upon failure to receive an output pulse within a first predetermined period; and generating a second output signal upon failure to receive an output pulse within a second predetermined period.

22. The method recited in claim 21, wherein: the first and second predetermined periods are equal.

23. The method recited in claim 21, including the step of:

regulating the pulse width of the pulses corresponding to each edge transition in accordance with the minimum pulse width of the counter.

24. The method recited in claim 21, including the step of:

generating a third output signal in the absence of the first output signal and in the presence of an activating signal.

25. The method recited in claim 21, including the step of:

inhibiting the application of the clock signal to the counter in response to the second output signal.

26. The method recited in claim 21, including the step of:

resetting the counter in the presence of a deactivating signal.

27. Monitoring system for verifying that an input signal is toggling at a minimum frequency, comprising:

edge detection means for providing an output signal in response to each transition in the state of the input signal;

resettable means responsive to the output signal from said edge detection means for resetting upon receipt of an output signal from said edge detection means within a first reset period;

said resettable means generating a first output signal upon failing to receive an output signal from said edge detection means within the first reset period and generating a second output signal upon failing to receive an output signal from said edge detection means within a second following reset period; and inverter means electrically coupled to said resettable means for receiving the first and second output signals therefrom.

28. Monitoring system for verifying that an input signal is toggling at a minimum frequency, comprising:

edge detection means for providing an output signal in response to each transition in the state of the input signal;

resettable means responsive to the output signal from said edge detection means for resetting upon receipt of an output signal from said edge detection means within a first reset period;

said resettable means generating a first output signal upon failing to receive an output signal from said edge detection means within the first reset period and generating a second output signal upon failing to receive an output signal from said edge detection means within a second following reset period; and gate means for providing a third output signal when enabled and the first output signal is absent from said resettable means.

29. Monitoring system for verifying that an input signal is toggling at a minimum frequency, comprising:

edge detection means for providing an output signal in response to each transition in the state of the input signal;

resettable means responsive to the output signal from said edge detection means for resetting upon receipt of an output signal from said edge detection means within a first reset period;

said resettable means generating a first output signal upon failing to receive an output signal from said edge detection means within the first reset period and generating a second output signal upon failing to receive an output signal from said edge detection means within a second following reset period;

said resettable means including a clock input terminal for receiving clock timing pulses for establishing the duration of the first and second reset periods; and gate means electrically coupled to said clock terminal and the output of said resettable means for deactivating said clock terminal in response to the presence of the second output signal from said resettable means.

30. Monitoring system for verifying that an input signal is toggling at a minimum frequency, comprising:

edge detection means for providing an output signal in response to each transition in the state of the input signal;

resettable means responsive to the output signal from said edge detection means for resetting upon receipt of an output signal from said edge detection means within a first reset period;

said resettable means generating a first output signal upon failing to receive an output signal from said edge detection seans within the first reset period and generating a second output signal upon failing to receive an output signal from said edge detection means within a second following reset period; and said resettable means including an N bit counter.

31. Monitoring system for verifying that an input signal is toggling at a minimum frequency, comprising:

edge detection means for providing an output signal in response to each transition in the state of the input signal;

resettable means responsive to the output signal from said edge detection means for resetting upon receipt of an output signal from said edge detection means within a first reset period;

said resettable means generating a first output signal upon failing to receive an output signal from said edge detection means within the first reset period and generating a second output signal upon failing to receive an output signal from output signal upon failing to receive an output signal from said edge detection means within a second following reset period; and said edge detection means including a plurality of Schmitt inverters for regulating the pulse width of the output pulses which correspond to the edge transitions in the logic state of the input signal, first gate means coupled to said Schmitt inverters for providing an output in response to an edge transition in the state of the input signal from high to low and low to high, and second gate means coupled to said first gate means and said resettable means for providing an input signal to said resettable means in response to an output pulse from said first gate means.

* * * * *